(12) United States Patent
Lim

(10) Patent No.: US 11,528,936 B2
(45) Date of Patent: Dec. 20, 2022

(54) AEROSOL GENERATING DEVICE

(71) Applicant: KT&G CORPORATION, Daejeon (KR)

(72) Inventor: Hun Il Lim, Seoul (KR)

(73) Assignee: KT&G CORPORATION, Daejeon (KR)

( * ) Notice: Subject to any disclaimer, the term of this patent is extended or adjusted under 35 U.S.C. 154(b) by 407 days.

(21) Appl. No.: 16/639,012

(22) PCT Filed: Oct. 25, 2018

(86) PCT No.: PCT/KR2018/012676
§ 371 (c)(1),
(2) Date: Feb. 13, 2020

(87) PCT Pub. No.: WO2019/088559
PCT Pub. Date: May 9, 2019

(65) Prior Publication Data
US 2020/0359695 A1    Nov. 19, 2020

(30) Foreign Application Priority Data

Oct. 30, 2017 (KR) .......................... 10-2017-0142578
May 25, 2018 (KR) .......................... 10-2018-0059580

(51) Int. Cl.
*H05K 1/02* (2006.01)
*A24F 40/42* (2020.01)
(Continued)

(52) U.S. Cl.
CPC ............ *A24F 40/42* (2020.01); *A24B 15/167* (2016.11); *A24D 1/20* (2020.01); *A24D 3/17* (2020.01);
(Continued)

(58) Field of Classification Search
CPC ...... H05K 1/0277; H05K 1/119; H05K 1/181; A24F 40/42
See application file for complete search history.

(56) References Cited

U.S. PATENT DOCUMENTS

| 5,348,027 A | 9/1994 | Barnes et al. |
| 5,388,594 A | 2/1995 | Counts et al. |

(Continued)

FOREIGN PATENT DOCUMENTS

| CA | 2 778 903 A1 | 5/2011 |
| CA | 2 970 045 A1 | 6/2016 |

(Continued)

OTHER PUBLICATIONS

Extended European Search Report dated Oct. 15, 2021 in European Application No. 18872138.5.

(Continued)

*Primary Examiner* — Jeremy C Norris
(74) *Attorney, Agent, or Firm* — Sughrue Mion, PLLC

(57) ABSTRACT

An aerosol generating device includes at least one heater, a battery, and a controller, and generates aerosol by heating a cigarette. The aerosol generating device according to the present exemplary embodiment includes a main printed circuit board (PCB) and an auxiliary PCB formed out of a rigid material and a connecting PCB formed out of a flexible material, and the connecting PCB may electrically connect the main PCB to the auxiliary PCB. Also, the aerosol generating device according to the present exemplary embodiment may include a rigid-flexible PCB.

12 Claims, 8 Drawing Sheets

(51) Int. Cl.

| | | |
|---|---|---|
| *A24D 1/20* | (2020.01) | |
| *A24D 3/17* | (2020.01) | |
| *A24F 15/01* | (2020.01) | |
| *A24F 40/10* | (2020.01) | |
| *A24F 40/20* | (2020.01) | |
| *A24F 40/30* | (2020.01) | |
| *A24F 40/40* | (2020.01) | |
| *A24F 40/44* | (2020.01) | |
| *A24F 40/46* | (2020.01) | |
| *A24F 40/485* | (2020.01) | |
| *A24F 40/50* | (2020.01) | |
| *A24F 40/57* | (2020.01) | |
| *A24F 40/60* | (2020.01) | |
| *A24F 40/65* | (2020.01) | |
| *A24F 40/90* | (2020.01) | |
| *A24F 40/95* | (2020.01) | |
| *F21V 3/00* | (2015.01) | |
| *F21V 5/00* | (2018.01) | |
| *G02B 19/00* | (2006.01) | |
| *H05B 3/54* | (2006.01) | |
| *H05K 1/14* | (2006.01) | |
| *H05K 1/18* | (2006.01) | |
| *A24B 15/167* | (2020.01) | |
| *A24F 40/51* | (2020.01) | |
| *F21Y 115/10* | (2016.01) | |

(52) U.S. Cl.
CPC .............. *A24F 15/01* (2020.01); *A24F 40/10* (2020.01); *A24F 40/20* (2020.01); *A24F 40/30* (2020.01); *A24F 40/40* (2020.01); *A24F 40/44* (2020.01); *A24F 40/46* (2020.01); *A24F 40/485* (2020.01); *A24F 40/50* (2020.01); *A24F 40/57* (2020.01); *A24F 40/60* (2020.01); *A24F 40/65* (2020.01); *A24F 40/90* (2020.01); *A24F 40/95* (2020.01); *F21V 3/00* (2013.01); *F21V 5/00* (2013.01); *G02B 19/0009* (2013.01); *G02B 19/0061* (2013.01); *H05B 3/54* (2013.01); *H05K 1/0203* (2013.01); *H05K 1/0277* (2013.01); *H05K 1/148* (2013.01); *H05K 1/181* (2013.01); *A24F 40/51* (2020.01); *F21Y 2115/10* (2016.08); *H05K 2201/012* (2013.01); *H05K 2201/0154* (2013.01); *H05K 2201/10219* (2013.01)

(56) References Cited

U.S. PATENT DOCUMENTS

| | | | |
|---|---|---|---|
| 5,408,574 | A | 4/1995 | Deevi et al. |
| 5,505,214 | A | 4/1996 | Collins et al. |
| 5,555,476 | A | 9/1996 | Suzuki et al. |
| 5,665,262 | A | 9/1997 | Hajaligol et al. |
| 5,692,525 | A | 12/1997 | Counts et al. |
| 5,723,228 | A | 3/1998 | Okamoto |
| 5,750,964 | A | 5/1998 | Counts et al. |
| 5,878,752 | A | 3/1999 | Adams et al. |
| 5,902,501 | A | 5/1999 | Nunnally et al. |
| 5,949,346 | A | 9/1999 | Suzuki et al. |
| 6,026,820 | A | 2/2000 | Baggett, Jr. et al. |
| 6,615,840 | B1 | 9/2003 | Fournier et al. |
| 6,803,550 | B2 | 10/2004 | Sharpe et al. |
| 6,810,883 | B2 | 11/2004 | Felter et al. |
| 7,082,825 | B2 | 8/2006 | Aoshima et al. |
| 7,594,945 | B2 | 9/2009 | Kim et al. |
| 7,682,571 | B2 | 3/2010 | Kim et al. |
| 7,726,320 | B2 | 6/2010 | Robinson et al. |
| 8,205,622 | B2 | 6/2012 | Pan |
| 8,558,147 | B2 | 10/2013 | Greim et al. |
| 8,602,037 | B2 | 12/2013 | Inagaki |
| 8,689,804 | B2 | 4/2014 | Fernando et al. |
| 8,833,364 | B2 | 9/2014 | Buchberger |
| 8,997,754 | B2 | 4/2015 | Tucker et al. |
| 9,084,440 | B2 | 7/2015 | Zuber et al. |
| 9,165,484 | B2 | 10/2015 | Choi |
| 9,295,286 | B2 | 3/2016 | Shin |
| 9,347,644 | B2 | 5/2016 | Araki et al. |
| 9,405,148 | B2 | 8/2016 | Chang et al. |
| 9,420,829 | B2 | 8/2016 | Thorens et al. |
| 9,516,899 | B2 | 12/2016 | Plojoux et al. |
| 9,532,600 | B2 | 1/2017 | Thorens et al. |
| 9,541,820 | B2 | 1/2017 | Ogawa |
| 9,693,587 | B2 | 7/2017 | Plojoux et al. |
| 9,713,345 | B2 | 7/2017 | Farine et al. |
| 9,839,238 | B2 | 12/2017 | Worm et al. |
| 9,844,234 | B2 | 12/2017 | Thorens et al. |
| 9,848,651 | B2 | 12/2017 | Wu |
| 9,854,845 | B2 | 1/2018 | Plojoux et al. |
| 9,949,507 | B2 | 4/2018 | Flick |
| 9,974,117 | B2 | 5/2018 | Qiu |
| 10,070,667 | B2 | 9/2018 | Lord et al. |
| 10,104,909 | B2 | 10/2018 | Han et al. |
| 10,104,911 | B2 | 10/2018 | Thorens et al. |
| 10,136,673 | B2 | 11/2018 | Mironov |
| 10,136,675 | B2 | 11/2018 | Li et al. |
| 10,143,232 | B2 | 12/2018 | Talon |
| 10,238,149 | B2 | 3/2019 | Hon |
| 10,390,564 | B2 | 8/2019 | Fernando et al. |
| 10,412,994 | B2 | 9/2019 | Schennum et al. |
| 10,426,193 | B2 | 10/2019 | Schennum et al. |
| 10,548,350 | B2 | 2/2020 | Greim et al. |
| 10,555,555 | B2 | 2/2020 | Fernando et al. |
| 10,602,778 | B2 | 3/2020 | Hu et al. |
| 10,617,149 | B2 | 4/2020 | Malgat et al. |
| 10,694,783 | B2 | 6/2020 | Jochnowitz |
| 10,701,973 | B2 | 7/2020 | Lee |
| 10,842,194 | B2 | 11/2020 | Batista et al. |
| 10,973,087 | B2 | 4/2021 | Wang et al. |
| 11,051,545 | B2 | 7/2021 | Batista et al. |
| 11,051,550 | B2 | 7/2021 | Lin et al. |
| 11,147,316 | B2 | 10/2021 | Farine et al. |
| 2003/0226837 | A1 | 12/2003 | Blake et al. |
| 2004/0089314 | A1 | 5/2004 | Felter et al. |
| 2004/0149737 | A1 | 8/2004 | Sharpe et al. |
| 2005/0142036 | A1 | 6/2005 | Kim et al. |
| 2006/0267614 | A1 | 11/2006 | Lee et al. |
| 2007/0007266 | A1 | 1/2007 | Sasaki et al. |
| 2007/0074734 | A1 | 4/2007 | Braunshteyn et al. |
| 2007/0246382 | A1 | 10/2007 | He |
| 2007/0267031 | A1 | 11/2007 | Hon |
| 2010/0313901 | A1 | 12/2010 | Fernando et al. |
| 2011/0226236 | A1 | 9/2011 | Buchberger |
| 2011/0234069 | A1 | 9/2011 | Chen et al. |
| 2013/0014772 | A1 | 1/2013 | Liu |
| 2013/0228191 | A1 | 9/2013 | Newton |
| 2013/0255675 | A1 | 10/2013 | Liu |
| 2014/0060554 | A1 | 3/2014 | Collett et al. |
| 2014/0069424 | A1 | 3/2014 | Poston et al. |
| 2014/0209105 | A1 | 7/2014 | Sears et al. |
| 2014/0217085 | A1 | 8/2014 | Alima |
| 2014/0261487 | A1 | 9/2014 | Chapman et al. |
| 2014/0286630 | A1 | 9/2014 | Buchberger |
| 2014/0339509 | A1 | 11/2014 | Choi et al. |
| 2014/0345633 | A1 | 11/2014 | Talon et al. |
| 2014/0353856 | A1 | 12/2014 | Dubief |
| 2015/0020831 | A1 | 1/2015 | Weigensberg et al. |
| 2015/0223520 | A1 | 8/2015 | Phillips et al. |
| 2015/0230521 | A1 | 8/2015 | Talon |
| 2015/0282527 | A1 | 10/2015 | Henry, Jr. |
| 2015/0327596 | A1 | 11/2015 | Alarcon et al. |
| 2016/0103364 | A1 | 4/2016 | Nam et al. |
| 2016/0128386 | A1 | 5/2016 | Chen |
| 2016/0174613 | A1 | 6/2016 | Zuber et al. |
| 2016/0205998 | A1 | 7/2016 | Matsumoto et al. |
| 2016/0321879 | A1 | 11/2016 | Oh et al. |
| 2016/0324216 | A1 | 11/2016 | Li et al. |
| 2016/0331030 | A1 | 11/2016 | Ampolini et al. |
| 2016/0345625 | A1 | 12/2016 | Liu |
| 2017/0020195 | A1 | 1/2017 | Cameron |
| 2017/0042227 | A1 | 2/2017 | Gavrielov et al. |

(56) References Cited

U.S. PATENT DOCUMENTS

| | | | |
|---|---|---|---|
| 2017/0055589 A1 | 3/2017 | Fernando et al. |
| 2017/0119051 A1 | 5/2017 | Blandino et al. |
| 2017/0119053 A1 | 5/2017 | Henry, Jr. et al. |
| 2017/0143041 A1 | 5/2017 | Batista et al. |
| 2017/0188634 A1 | 7/2017 | Plojoux et al. |
| 2017/0197043 A1 | 7/2017 | Buchberger |
| 2017/0197046 A1 | 7/2017 | Buchberger |
| 2017/0214261 A1 | 7/2017 | Gratton |
| 2017/0238609 A1 | 8/2017 | Schlipf |
| 2017/0295844 A1 | 10/2017 | Thevenaz et al. |
| 2017/0325505 A1 | 11/2017 | Force et al. |
| 2017/0347715 A1 | 12/2017 | Mironov et al. |
| 2018/0027878 A1 | 2/2018 | Dendy et al. |
| 2018/0028993 A1 | 2/2018 | Dubief |
| 2018/0160733 A1 | 6/2018 | Leadley et al. |
| 2018/0199630 A1 | 7/2018 | Qiu |
| 2019/0059448 A1 | 2/2019 | Talon |
| 2019/0159524 A1 | 5/2019 | Qiu |
| 2019/0281896 A1 | 9/2019 | Chapman et al. |
| 2020/0093177 A1 | 3/2020 | Han et al. |
| 2020/0093185 A1 | 3/2020 | Lim |
| 2020/0094997 A1 | 3/2020 | Menon et al. |
| 2020/0154765 A1 | 5/2020 | Lee et al. |
| 2020/0196670 A1 | 6/2020 | Alarcon et al. |
| 2020/0260790 A1 | 8/2020 | Kaufman et al. |
| 2020/0305240 A1 | 9/2020 | Holoubek et al. |
| 2020/0329772 A1 | 10/2020 | Kim et al. |
| 2020/0359681 A1 | 11/2020 | Han et al. |
| 2020/0404969 A1 | 12/2020 | Zuber et al. |

FOREIGN PATENT DOCUMENTS

| | | | |
|---|---|---|---|
| CN | 1078621 A | 11/1993 |
| CN | 1126425 A | 7/1996 |
| CN | 1190335 A | 8/1998 |
| CN | 1280661 A | 1/2001 |
| CN | 1491598 A | 4/2004 |
| CN | 1633247 A | 6/2005 |
| CN | 1871987 A | 12/2006 |
| CN | 101277622 A | 10/2008 |
| CN | 101324490 A | 12/2008 |
| CN | 101518361 A | 9/2009 |
| CN | 101557728 A | 10/2009 |
| CN | 101637308 A | 2/2010 |
| CN | 201657047 U | 11/2010 |
| CN | 102264251 A | 11/2011 |
| CN | 102595943 A | 7/2012 |
| CN | 202385727 U | 8/2012 |
| CN | 102665459 A | 9/2012 |
| CN | 103099319 A | 5/2013 |
| CN | 202907797 U | 5/2013 |
| CN | 203040065 U | 7/2013 |
| CN | 103271447 A | 9/2013 |
| CN | 103477252 A | 12/2013 |
| CN | 103519351 A | 1/2014 |
| CN | 103653257 A | 3/2014 |
| CN | 103653258 A | 3/2014 |
| CN | 203492793 U | 3/2014 |
| CN | 103889258 A | 6/2014 |
| CN | 103974635 A | 8/2014 |
| CN | 103974638 A | 8/2014 |
| CN | 103974640 A | 8/2014 |
| CN | 103997922 A | 8/2014 |
| CN | 104146353 A | 11/2014 |
| CN | 104188110 A | 12/2014 |
| CN | 104219973 A | 12/2014 |
| CN | 204120226 U | 1/2015 |
| CN | 204146340 U | 2/2015 |
| CN | 104423130 A | 3/2015 |
| CN | 204393344 U | 6/2015 |
| CN | 104886776 A | 9/2015 |
| CN | 105188430 A | 12/2015 |
| CN | 204838003 U | 12/2015 |
| CN | 105326092 A | 2/2016 |
| CN | 205072064 U | 3/2016 |
| CN | 205180371 U | 4/2016 |
| CN | 105722416 A | 6/2016 |
| CN | 205358225 U | 7/2016 |
| CN | 105852221 A | 8/2016 |
| CN | 205456064 U | 8/2016 |
| CN | 205624474 U | 10/2016 |
| CN | 106136331 A | 11/2016 |
| CN | 106163304 A | 11/2016 |
| CN | 106170215 A | 11/2016 |
| CN | 205671480 U | 11/2016 |
| CN | 106231934 A | 12/2016 |
| CN | 106235419 A | 12/2016 |
| CN | 205831079 U | 12/2016 |
| CN | 106418729 A | 2/2017 |
| CN | 106473232 A | 3/2017 |
| CN | 106473233 A | 3/2017 |
| CN | 106490686 A | 3/2017 |
| CN | 106690427 A | 5/2017 |
| CN | 106723379 A | 5/2017 |
| CN | 106793834 A | 5/2017 |
| CN | 206197012 U | 5/2017 |
| CN | 106912985 A | 7/2017 |
| CN | 206314585 U | 7/2017 |
| CN | 106998816 A | 8/2017 |
| CN | 107105772 A | 8/2017 |
| CN | 206442590 U | 8/2017 |
| CN | 206443202 U | 8/2017 |
| CN | 206443214 U | 8/2017 |
| CN | 107173850 A | 9/2017 |
| CN | 107183789 A | 9/2017 |
| CN | 206462413 U | 9/2017 |
| CN | 107249366 A | 10/2017 |
| CN | 107278125 A | 10/2017 |
| CN | 206547882 U | 10/2017 |
| CN | 107801375 A | 3/2018 |
| CN | 108013512 A | 5/2018 |
| CN | 110325058 A | 10/2019 |
| CN | 110958841 A | 4/2020 |
| EA | 201290392 A1 | 10/2012 |
| EA | 201290240 A1 | 12/2012 |
| EA | 026076 B1 | 2/2017 |
| EP | 0 438 862 A2 | 7/1991 |
| EP | 0 917 831 A1 | 5/1999 |
| EP | 1 947 965 A2 | 7/2008 |
| EP | 2 201 850 A1 | 6/2010 |
| EP | 2 316 286 A1 | 5/2011 |
| EP | 2 340 729 A1 | 7/2011 |
| EP | 2 677 273 A1 | 12/2013 |
| EP | 3 257 386 B1 | 6/2019 |
| EP | 3 248 486 B1 | 8/2019 |
| EP | 3 248 485 B1 | 4/2020 |
| ER | 0 822 760 B1 | 6/2003 |
| ER | 2 327 318 A1 | 6/2011 |
| ER | 2368449 A1 | 9/2011 |
| ER | 2 921 065 A1 | 9/2015 |
| ER | 3 569 076 A1 | 11/2019 |
| ER | 3 656 229 A2 | 5/2020 |
| GB | 2 301 894 A | 12/1996 |
| GB | 2514893 A | 12/2014 |
| JP | 62-15793 A | 1/1987 |
| JP | 6-73784 U | 10/1994 |
| JP | 7-72809 A | 3/1995 |
| JP | 7-184627 A | 7/1995 |
| JP | 9-75058 A | 3/1997 |
| JP | 9-161822 A | 6/1997 |
| JP | 9-228919 A | 9/1997 |
| JP | 10-37781 A | 2/1998 |
| JP | 2003-527127 A | 9/2003 |
| JP | 2004-212102 A | 7/2004 |
| JP | 2005-199913 A | 7/2005 |
| JP | 2006-292620 A | 10/2006 |
| JP | 3898118 B2 | 3/2007 |
| JP | 2007-101639 A | 4/2007 |
| JP | 2010-266425 A | 11/2010 |
| JP | 2012-513750 A | 6/2012 |
| JP | 2013-509160 A | 3/2013 |
| JP | 2013-524835 A | 6/2013 |
| JP | 2014-216287 A | 11/2014 |
| JP | 2014-533513 A | 12/2014 |

(56) References Cited

FOREIGN PATENT DOCUMENTS

| | | |
|---|---|---|
| JP | 2015-13192 A | 1/2015 |
| JP | 2015-503916 A | 2/2015 |
| JP | 2015-504669 A | 2/2015 |
| JP | 2015-506170 A | 3/2015 |
| JP | 2015-528307 A | 9/2015 |
| JP | 2016-512033 A | 4/2016 |
| JP | 2016-521552 A | 7/2016 |
| JP | 2017-506901 A | 3/2017 |
| JP | 2017-510270 A | 4/2017 |
| JP | 2017-511123 A | 4/2017 |
| JP | 2017-127300 A | 7/2017 |
| JP | 2017-522876 A | 8/2017 |
| KR | 1999-0081973 A | 11/1999 |
| KR | 20-0203233 Y1 | 11/2000 |
| KR | 10-0304044 B1 | 11/2001 |
| KR | 10-2004-0084899 A | 10/2004 |
| KR | 10-2005-0065896 A | 6/2005 |
| KR | 10-0495099 B1 | 11/2005 |
| KR | 10-2006-0121638 A | 11/2006 |
| KR | 10-0782063 B1 | 12/2007 |
| KR | 10-1012472 B1 | 2/2011 |
| KR | 10-2011-0096548 A | 8/2011 |
| KR | 10-1062248 B1 | 9/2011 |
| KR | 20-2011-0008931 U | 9/2011 |
| KR | 10-2012-0027029 A | 3/2012 |
| KR | 10-2012-0050568 A | 5/2012 |
| KR | 20-0460461 Y1 | 5/2012 |
| KR | 10-1174189 B1 | 8/2012 |
| KR | 10-2012-0101637 A | 9/2012 |
| KR | 10-2012-0102131 A | 9/2012 |
| KR | 10-2012-0104533 A | 9/2012 |
| KR | 10-2012-0115488 A | 10/2012 |
| KR | 20-2012-0007263 U | 10/2012 |
| KR | 20-2012-0008751 U | 12/2012 |
| KR | 10-2013-0031025 A | 3/2013 |
| KR | 10-1239080 B1 | 3/2013 |
| KR | 10-2013-0084789 A | 7/2013 |
| KR | 10-2013-0139276 A | 12/2013 |
| KR | 10-2013-0139298 A | 12/2013 |
| KR | 10-1338073 B1 | 12/2013 |
| KR | 10-2014-0116055 A | 10/2014 |
| KR | 10-2014-0116381 A | 10/2014 |
| KR | 10-2014-0118980 A | 10/2014 |
| KR | 10-2014-0119029 A | 10/2014 |
| KR | 10-2014-0135568 A | 11/2014 |
| KR | 10-1465846 B1 | 11/2014 |
| KR | 10-1480423 B1 | 1/2015 |
| KR | 10-1486294 B1 | 1/2015 |
| KR | 10-2015-0111021 A | 10/2015 |
| KR | 10-2016-0005323 A | 1/2016 |
| KR | 10-2016-0012154 A | 2/2016 |
| KR | 10-2016-0031801 A | 3/2016 |
| KR | 10-2016-0052607 A | 5/2016 |
| KR | 10-1631286 B1 | 6/2016 |
| KR | 10-1635340 B1 | 6/2016 |
| KR | 10-2016-0082570 A | 7/2016 |
| KR | 10-2016-0086118 A | 7/2016 |
| KR | 10-2016-0088163 A | 7/2016 |
| KR | 10-1660214 B1 | 9/2016 |
| KR | 10-1677547 B1 | 11/2016 |
| KR | 10-1679163 B1 | 11/2016 |
| KR | 10-2017-0006282 A | 1/2017 |
| KR | 10-2017-0020807 A | 2/2017 |
| KR | 10-1733448 B1 | 5/2017 |
| KR | 10-2017-0067171 A | 6/2017 |
| KR | 10-2017-0083596 A | 7/2017 |
| KR | 10-2017-0117444 A | 10/2017 |
| KR | 10-2017-0118233 A1 | 10/2017 |
| KR | 10-2018-0125852 A | 11/2018 |
| KR | 10-2018-0129637 A | 12/2018 |
| KR | 10-2019-0016907 A | 2/2019 |
| RU | 2 132 629 C1 | 7/1999 |
| RU | 2551944 C1 | 6/2015 |
| RU | 2611487 C2 | 2/2017 |
| RU | 2617297 C2 | 4/2017 |
| RU | 2 619 735 C1 | 5/2017 |
| RU | 2015152134 A | 6/2017 |
| WO | 95/27412 A1 | 10/1995 |
| WO | 98/23171 A1 | 6/1998 |
| WO | 2007039794 A2 | 4/2007 |
| WO | 2009/044716 A1 | 4/2009 |
| WO | 2010073122 A1 | 7/2010 |
| WO | 2011/015826 A1 | 2/2011 |
| WO | 2011/050964 A1 | 5/2011 |
| WO | 2011/063970 A1 | 6/2011 |
| WO | 2013/102609 A2 | 7/2013 |
| WO | 2014/195679 A2 | 12/2014 |
| WO | 2015/035510 A1 | 3/2015 |
| WO | 2015/070402 A1 | 5/2015 |
| WO | 2015/082560 A1 | 6/2015 |
| WO | 2015/174657 A1 | 11/2015 |
| WO | 2015/177046 A1 | 11/2015 |
| WO | 2015/189388 A1 | 12/2015 |
| WO | 2016/009202 A1 | 1/2016 |
| WO | 2016/012795 A1 | 1/2016 |
| WO | 2016/091658 A1 | 6/2016 |
| WO | 2016/096337 A1 | 6/2016 |
| WO | 2016/111633 A1 | 7/2016 |
| WO | 2016/123738 A1 | 8/2016 |
| WO | 2016/127541 A1 | 8/2016 |
| WO | 2016120177 A1 | 8/2016 |
| WO | 2016/138689 A1 | 9/2016 |
| WO | 2016/199065 A1 | 12/2016 |
| WO | 2016/199066 A1 | 12/2016 |
| WO | 2016/207407 A1 | 12/2016 |
| WO | 2017/001818 A1 | 1/2017 |
| WO | 2017/005471 A1 | 1/2017 |
| WO | 2017/029089 A1 | 2/2017 |
| WO | 2017/077466 A1 | 5/2017 |
| WO | 2017/133056 A1 | 8/2017 |
| WO | 2017/163046 A1 | 9/2017 |
| WO | 2017/182485 A1 | 10/2017 |
| WO | 2017/211600 A1 | 12/2017 |
| WO | 2018/190606 A1 | 10/2018 |
| WO | 2018/191766 A1 | 10/2018 |
| WO | 2019/015343 A1 | 1/2019 |

OTHER PUBLICATIONS

Communication dated Dec. 3, 2021 from the Chinese Patent Office in Chinese Application No. 201880049465.2.
Communication dated Dec. 2, 2021 from the Chinese Patent Office in Chinese Application No. 201880048657.1.
Communication dated Dec. 2, 2021 from the Chinese Patent Office in Chinese Application No. 201880048444.9.
Office Action dated Jan. 24, 2022 in Chinese Application No. 201880030661.5.
Office Action dated Dec. 24, 2021 in Chinese Application No. 201880055847.6.
Office Action dated Dec. 20, 2021 in Chinese Application No. 201880048655.2.
Office Action dated Jan. 4, 2022 in Chinese Application No. 201880048703.8.
Office Action dated Jan. 18, 2022 in Chinese Application No. 201880052857.4.
Office Action dated Jan. 30, 2022 in Chinese Application No. 201880052855.5.
"PCB Design and Processing", Seping, pp. 32-35, Beijing Institute of Technology Publishing House, Feb. 2017, Feb. 28, 2017 (6 pages total).
Office Action dated Dec. 31, 2021 in Chinese Application No. 201880049189.X.
Extended European Search Report dated Jan. 15, 2021 in European Application No. 18799246.6.
Office Action dated May 25, 2020 in Russian Application No. 2019135871.
Office Action dated Jun. 10, 2020 in Korean Application No. 10-2018-0052137.
Office Action dated Oct. 5, 2020 in Korean Application No. 10-2020-0090577.

(56) References Cited

OTHER PUBLICATIONS

Office Action dated Oct. 16, 2020 in Korean Application No. 10-2020-0092553.
Extended European Search Report dated Nov. 16, 2020 in European Application No. 20189002.7.
Office Action dated Dec. 8, 2020 in Russian Application No. 2020113632.
Office Action dated Nov. 25, 2020 in Russian Application No. 2020124810.
Office Action dated Jan. 26, 2021 in Japanese Application No. 2020-502671.
Office Action dated Dec. 22, 2020 in Japanese Application No. 2020-502181.
Office Action dated Dec. 22, 2020 in Japanese Application No. 2020-503856.
Extended European Search Report dated Nov. 13, 2020 in European Application No. 20188970.6.
Office Action dated Nov. 10, 2020 in Japanese Application No. 2020-523671.
Office Action dated Nov. 24, 2020 in Russian Application No. 2020124811.
Office Action dated Aug. 12, 2019 in Korean Application No. 10-2019-0033722.
Office Action dated Jul. 2, 2019 in Korean Application No. 10-2019-0017392.
Office Action dated Jul. 3, 2019 in Korean Application No. 10-2019-0016835.
Office Action dated May 18, 2019 in Korean Application No. 10-2018-0090063.
Office Action dated Oct. 25, 2019 in Korean Application No. 10-2018-0078296.
Office Action dated Oct. 15, 2019 in Korean Application No. 10-2018-0074188.
Office Action dated Oct. 8, 2019 in Korean Application No. 10-2018-0072992.
Office Action dated Oct. 8, 2019 in Korean Application No. 10-2018-0072935.
Office Action dated Sep. 6, 2019 in Korean Application No. 10-2018-0069645.
Office Action dated Jul. 10, 2019 in Korean Application No. 10-2018-0064487.
Office Action dated Jun. 24, 2019 in Korean Application No. 10-2018-0062137.
Office Action dated Jun. 19, 2019 in Korean Application No. 10-2018-0059580.
Office Action dated May 13, 2019 in Korean Application No. 10-2018-0058596.
Office Action dated May 3, 2019 in Korean Application No. 10-2018-0055120.
Office Action dated Dec. 9, 2019 in Korean Application No. 10-2018-0052133.
Office Action dated Dec. 9, 2019 in Korean Application No. 10-2018-0051469.
Office Action dated Dec. 9, 2019 in Korean Application No. 10-2018-0051467.
International Search Report dated Apr. 16, 2019 in International Application No. PCT/KR2018/012899.
International Search Report dated Apr. 26, 2019 in International Application No. PCT/KR2018/012895.
International Search Report dated May 17, 2019 in International Application No. PCT/KR2018/012810.
International Search Report dated May 17, 2019 in International Application No. PCT/KR2018/012809.
International Search Report dated May 17, 2019 in International Application No. PCT/KR2018/012808.
International Search Report dated May 3, 2019 in International Application No. PCT/KR2018/012807.
International Search Report dated May 17, 2019 in International Application No. PCT/KR2018/012776.
International Search Report dated Apr. 3, 2019 in International Application No. PCT/KR2018/012775.
International Search Report dated Apr. 3, 2019 in International Application No. PCT/KR2018/012774.
International Search Report dated Apr. 3, 2019 in International Application No. PCT/KR2018/012773.
International Search Report dated May 20, 2019 in International Application No. PCT/KR2018/012685.
International Search Report dated May 21, 2019 in International Application No. PCT/KR2018/012676.
International Search Report dated Nov. 26, 2018 in International Application No. PCT/KR2018/005767.
International Search Report dated Aug. 28, 2018 in International Application No. PCT/KR2018/005693.
International Search Report dated Nov. 2, 2018 in International Application No. PCT/KR2018/005306.
Office Action dated Apr. 5, 2019 in Korean Application No. 10-2019-0017393.
Office Action dated Apr. 25, 2019 in Korean Application No. 10-2019-0033722.
Office Action dated Apr. 25, 2019 in Korean Application No. 10-2019-0033723.
Office Action dated Jun. 7, 2021 in Canadian Application No. 3,076,886.
Office Action dated Feb. 9, 2018 in Korean Application No. 10-2017-0058786.
Communication dated Jul. 27, 2020 by the Russian Patent Office in application No. 2020110821.
Communication dated Jun. 11, 2020 by the Korean Patent Office in application No. 10-2018-0051469.
Extended European Search Report dated Sep. 9, 2021 in European Application No. 18873562.5.
Office Action dated Aug. 3, 2021 in Japanese Application No. 2020-503856.
Extended European Search Report dated Aug. 18, 2021 in European Application No. 18874344.7.
Extended European Search Report dated Jul. 30, 2021 in European Application No. 18874446.0.
Extended European Search Report dated Aug. 17, 2021 in European Application No. 18872432.2.
Office Action dated Aug. 17, 2021 in Japanese Application No. 2020-503962.
Extended European Search Report dated Aug. 10, 2021 in European Application No. 18873846.2.
Extended European Search Report dated Aug. 17, 2021 in European Application No. 18873943.7.
Extended European Search Report dated Aug. 10, 2021 in European Application No. 18874742.2.
Extended European Search Report dated Aug. 12, 2021 in European Application No. 18874837.0.
Extended European Search Report dated Aug. 20, 2021 in European Application No. 18874962.6.
Extended European Search Report dated Aug. 6, 2021 in European Application No. 18872527.9.
Extended European Search Report dated Sep. 2, 2021 in European Application No. 18874839.6.
Extended European Search Report dated Jul. 20, 2021 in European Application No. 18872006.4.
Office Action dated Sep. 3, 2021 in Chinese Application No. 201880035480.1.
Office Action dated Aug. 11, 2021 in Chinese Application No. 201880029050.9.
Communication dated Feb. 24, 2021 by the Japanese Patent Office in application No. 2020-503962.
Communication dated Mar. 23, 2021 by the Japanese Patent Office in application No. 2020-522897.
Communication dated Mar. 2, 2021 by the Japanese Patent Office in application No. 2020-523669.
Communication dated Mar. 30, 2021 by the Japanese Patent Office in application No. 2020-501446.
Communication dated Mar. 16, 2021 by the Japanese Patent Office in application No. 2020-521441.

(56) References Cited

OTHER PUBLICATIONS

Communication dated Feb. 9, 2021 by the Japanese Patent Office in application No. 2020-501205.
Communication dated Mar. 16, 2021 by the European Patent Office in application No. 18806877.9.
Communication dated Feb. 28, 2022 from the Chinese Patent Office in Chinese Application No. 201880063459.2.
Communication dated Mar. 29, 2022 from the Japanese Patent Office in Japanese Application No. 2020-522897.
Communication dated Mar. 3, 2022 from the Chinese Patent Office in Chinese Application No. 201880058682.8.
Wenxue Geng et al., "Technology Manual of a Programmable Controller", Science Technology, 1st Edition, 1996, p. 132 (2 pages total).
Office Action dated Jul. 4, 2022 in Chinese Application No. 201880048657.1.
Office Action dated Jun. 28, 2022 in Japanese Application No. 2020-522897.
Office Action dated Jul. 12, 2022 in Chinese Application No. 201880049189.X.
Office Action dated Jun. 22, 2022 in Chinese Application No. 201880048444.9.
Su Zuen et al., "Heat Transfer", Dalian Maritime University Press, Feb. 28, 1989, pp. 12-13 (9 pages total).
Second Office Action issued in the China National Intellectual Property Administration dated Aug. 26, 2022, in corresponding Chinese Application No. 2018800487038.
Notice of Reasons for Refusal issued in the Japanese Patent Office dated Nov. 1, 2022 in corresponding Japanese Patent Application No. 2020-501205.

AEROSOL GENERATING DEVICE

TECHNICAL FIELD

The present disclosure provides an aerosol generating device.

BACKGROUND ART

Recently, demand has increased for alternative methods for overcoming drawbacks of general cigarettes. For example, there has been increasing demand for a method of generating aerosol by heating an aerosol generating material in a cigarette, rather than a method of generating aerosol by burning a cigarette.

A plurality of components are included in an electronic cigarette provided with a heater for heating a cigarette based on electricity, and when the plurality of components are not appropriately arranged, a total size of the electronic cigarette may increase.

Accordingly, research for reducing the size of an electronic cigarette and improving the portability of the electronic cigarette has been actively conducted.

DESCRIPTION OF EXEMPLARY EMBODIMENTS

Technical Problem

Provided is an aerosol generating device. A circuit inside an aerosol generating device according to an exemplary embodiment may be configured by using a rigid printed circuit board (RPCB) and a flexible PCB (FPCB) together or using a rigid-flexible PCB (RFPCB).

The technical problems to be solved by an exemplary embodiment are not limited to the above-described ones and one of ordinary skill in the art may understand other technical problems from the following description.

Solution to Problem

An aerosol generating device includes at least one heater, a battery, and a controller, and generates aerosol by heating a cigarette.

The aerosol generating device according to the present exemplary embodiment includes a main printed circuit board (PCB) and an auxiliary PCB formed out of a rigid material and a connecting PCB formed out of a flexible material, and the connecting PCB may electrically connect the main PCB to the auxiliary PCB. Also, the aerosol generating device according to the present exemplary embodiment may include a rigid-flexible PCB.

Advantageous Effects of Disclosure

According to the present disclosure, a circuit inside an aerosol generating device may be configured by using a rigid printed circuit board (RPCB) and a flexible PCB (FPCB) together or using a rigid-flexible PCB (RFPCB), thereby reducing the size of the aerosol generating device.

BEST MODE

Figure 1:
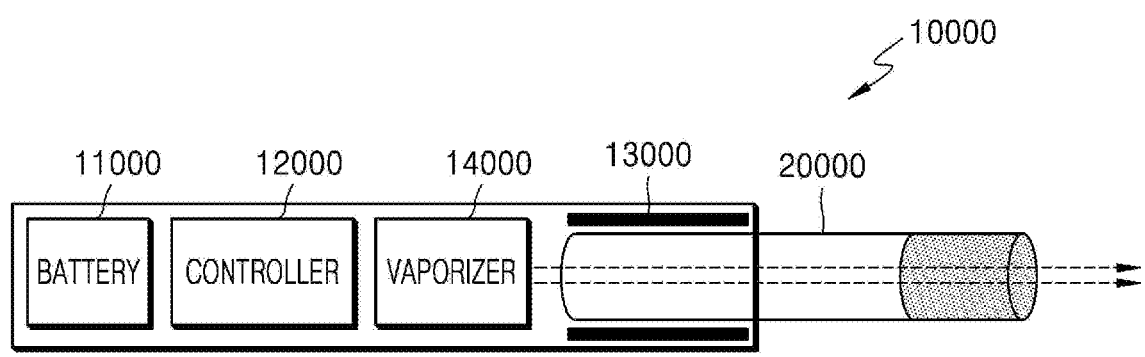
FIGS. 1 and 2 are diagrams showing examples in which a cigarette is inserted into an aerosol generating device.

According to an aspect of the present disclosure, an aerosol generating device includes: at least one heater configured to generate aerosol by heating an aerosol generating material; a battery configured to supply power to heat the at least one heater; a controller; and a main printed circuit board (PCB) and an auxiliary PCB that are formed out of a rigid material, wherein the main PCB is located parallel to a longitudinal direction of the aerosol generating device, and the auxiliary PCB is located perpendicular to the longitudinal direction of the aerosol generating device, wherein the main PCB and the auxiliary PCB are electrically connected to each other via a connecting PCB formed out of a flexible material.

Also, the main PCB may be located parallel to the longitudinal direction of the aerosol generating device at a side of at least one of the battery and the controller, and the auxiliary PCB may be located perpendicular to the longitudinal direction of the aerosol generating device between the at least one heater and the battery.

Also, the at least one heater may include: a heater configured to heat the aerosol generating material included in a cigarette; and a vaporizer configured to generate aerosol by heating a liquid composition, wherein the auxiliary PCB is electrically connected to the heater and the vaporizer.

Also, the aerosol generating device may further include a pressure sensor configured to detect inhalation pressure that is when a cigarette inserted into the aerosol generating device is inhaled, wherein the auxiliary PCB is electrically connected to the pressure sensor.

Also, the main PCB may be electrically connected to at least one of a temperature sensor for detecting a temperature of the at least one heater, an antenna for wireless communication with the outside, and an interface for indicating an operation state of the aerosol generating device.

Also, the rigid material of the main PCB and the auxiliary PCB may be Flame Retardant-4 (FR-4), and the flexible material of the connecting PCB may be polyimide.

Also, a heat dissipating plate may be attached to the auxiliary PCB in order to prevent the auxiliary PCB from being overheated by the at least one heater.

Also, the connecting PCB may include a first insulating layer, a conductive layer formed on the first insulating layer, and a second insulating layer stacked on the conductive layer, wherein the connecting PCB includes a connecting area for connecting the main PCB to the auxiliary PCB, and the connecting area includes a plating layer plated on the conductive layer exposed by peeling off the second insulating layer, wherein the main PCB and the auxiliary PCB are connected to the connecting PCB through the plating layer.

Also, each of the first insulating layer and the second insulating layer may include polyimide, the conductive layer may include copper, and the plating layer includes gold.

According to another aspect of the present disclosure, an aerosol generating device includes: at least one heater configured to generate aerosol by heating an aerosol generating material; a battery configured to supply power to heat the at least one heater; a controller; and a rigid-flexible printed circuit board (PCB), wherein a first rigid portion of the rigid-flexible PCB is located parallel to a longitudinal direction of the aerosol generating device, a second rigid portion is located perpendicular to the longitudinal direction of the aerosol generating device, and a flexible portion is curved and connects the first rigid portion to the second rigid portion.

Also, a material of the first rigid portion and the second rigid portion of the rigid-flexible PCB may be Flame-Retardant 4 (FR-4), and a material of the flexible portion may be polyimide.

Also, a heat dissipating plate may be attached to the rigid-flexible PCB in order to prevent the rigid-flexible PCB from being overheated by the at least one heater.

MODE OF DISCLOSURE

Although the terms used in exemplary embodiments of the present disclosure are selected from among common terms that are currently widely used in consideration of their functions in the present disclosure, the terms may be different according to the intention of one of ordinary skill in the art, a precedent, or the advent of new technology. Also, in particular cases, the terms are discretionally selected by the applicant of the present disclosure, and the meaning of those terms will be described in detail in the corresponding part of the detailed description. Therefore, the terms used in the present disclosure are not merely designations of the terms, but the terms are defined based on the meaning of the terms and content throughout the present disclosure.

Throughout the present application, when a part "includes" an element, it is to be understood that the part additionally includes other elements rather than excluding other elements as long as there is no particular opposing recitation. Also, the terms such as " . . . unit," "module," or the like used in the present application indicate a unit, which processes at least one function or motion, and the unit may be implemented by hardware or software, or by a combination of hardware and software.

Hereinafter, the present disclosure will be described in detail with reference to the accompanying drawings in order to enable one of ordinary skill in the art to easily embody and practice the present disclosure. However, the present disclosure is not limited to examples disclosed below, but may be implemented in various forms.

Hereinafter, exemplary embodiments of the present disclosure will be described in detail with reference to the drawings.

Figure 2:
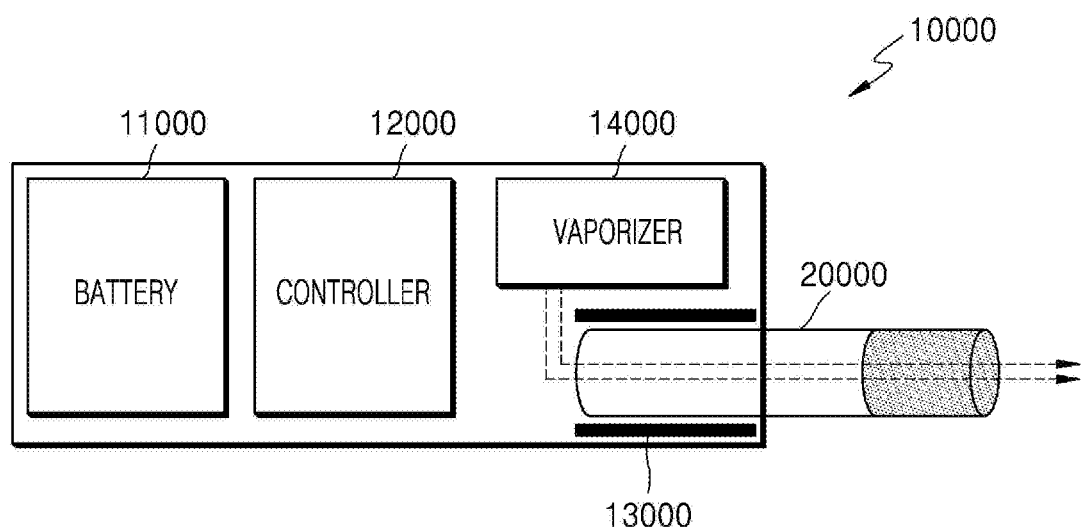

FIGS. 1 and 2 are diagrams showing examples in which a cigarette is inserted into an aerosol generating device.

Referring to FIGS. 1 and 2, an aerosol generating device 100 includes a battery 11000, a controller 12000, a heater 13000, and a vaporizer 14000. Also, a cigarette 20000 may be inserted into an inner space of the aerosol generating device 10000.

FIGS. 1 and 2 only illustrate components of the aerosol generating device 10000, which are related to the present exemplary embodiment. Therefore, it will be understood by one of ordinary skill in the art that other general-purpose components may be further included in the aerosol generating device 10000, in addition to the components illustrated in FIG. 1.

Also, FIGS. 1 and 2 illustrate that the aerosol generating device 10000 includes the heater 13000. However, as necessary, the heater 13000 may be omitted.

FIG. 1 illustrates that the battery 11000, the controller 12000, the vaporizer 14000, and the heater 13000 are arranged in series. On the other hand, FIG. 2 illustrates that the vaporizer 14000 and the heater 13000 are arranged in parallel. However, the internal structure of the aerosol generating device 10000 is not limited to the structures illustrated in FIG. 1 or FIG. 2. In other words, according to the design of the aerosol generating device 10000, the battery 11000, the controller 12000, the vaporizer 14000, and the heater 13000 may be differently arranged.

When the cigarette 20000 is inserted into the aerosol generating device 10000, the aerosol generating device 10000 may operate the vaporizer 14000 to generate aerosol. The aerosol generated by the vaporizer 14000 is delivered to the user by passing through the cigarette 20000. The vaporizer 14000 will be described in more detail later.

The battery 11000 may supply power to be used for the aerosol generating device 10000 to operate. For example, the battery 11000 may supply power to heat the heater 13000 or the vaporizer 14000 and may supply power for operating the controller 12000. Also, the battery 11000 may supply power for operations of a display, a sensor, a motor, etc. mounted in the aerosol generating device 10000.

The controller 12000 may generally control operations of the aerosol generating device 10000. In detail, the controller 12000 may control not only operations of the battery 11000, the heater 13000, and the vaporizer 14000, but also operations of other components included in the aerosol generating device 10000. Also, the controller 12000 may check a state of each of the components of the aerosol generating device 10000 to determine whether or not the aerosol generating device 10000 is in an operable state.

The controller 12000 may include at least one processor. A processor can be implemented as an array of a plurality of logic gates or can be implemented as a combination of a general-purpose microprocessor and a memory in which a program executable in the microprocessor is stored. It will be understood by one of ordinary skill in the art that the processor can be implemented in other forms of hardware.

The heater 13000 may be heated by the power supplied from the battery 11000. For example, when the cigarette 20000 is inserted into the aerosol generating device 10000, the heater 13000 may be located outside the cigarette 20000 and increase a temperature of an aerosol generating material in the cigarette 20000.

The heater 13000 may include an electro-resistive heater. For example, the heater 13000 may include an electrically conductive track, and the heater 13000 may be heated when currents flow through the electrically conductive track. However, the heater 13000 is not limited to the example described above and may include any other heaters which may be heated to a desired temperature. Here, the desired temperature may be pre-set in the aerosol generating device 10000 or may be set by a user.

As another example, the heater 13000 may include an induction heater. In detail, the heater 13000 may include an electrically conductive coil for heating a cigarette in an induction heating method, and the cigarette may include a susceptor which may be heated by the induction heater.

FIGS. 1 and 2 illustrate that the heater 13000 is positioned outside the cigarette 20000, but the position of the cigarette 20000 is not limited thereto. For example, the heater 13000 may include a tube-type heating element, a plate-type heating element, a needle-type heating element, or a rod-type heating element, and may heat the inside or the outside of the cigarette 20000, according to the shape of the heating element.

Also, the aerosol generating device 10000 may include a plurality of heaters 13000. Here, the plurality of heaters 13000 may be inserted into the cigarette 20000 or may be arranged outside the cigarette 20000. Also, some of the plurality of heaters 13000 may be inserted into the cigarette 20000, and the others may be arranged outside the cigarette 20000. In addition, the shape of the heater 13000 is not limited to the shapes illustrated in FIGS. 1 and 2 and may include various shapes.

The vaporizer 14000 may generate aerosol by heating a liquid composition and the generated aerosol may pass through the cigarette 20000 to be delivered to a user. In other words, the aerosol generated by the vaporizer 14000 may move along an air flow passage of the aerosol generating device 10000. The air flow passage may be configured such that the aerosol generated by the vaporizer 14000 passes through the cigarette 20000 to be delivered to the user.

For example, the vaporizer 14000 may include a liquid storage, a liquid delivery element, and a heating element, but it is not limited thereto. For example, the liquid storage, the liquid delivery element, and the heating element may be included in the aerosol generating device 10000 as independent modules.

The liquid storage may store a liquid composition. For example, the liquid composition may be a liquid including a tobacco-containing material having a volatile tobacco flavor component, or a liquid including a non-tobacco material. The liquid storage may be formed to be detachable from the vaporizer 14000 or may be formed integrally with the vaporizer 14000.

For example, the liquid composition may include water, a solvent, ethanol, plant extract, spices, flavorings, or a vitamin mixture. The spices may include menthol, peppermint, spearmint oil, and various fruit-flavored ingredients, but are not limited thereto. The flavorings may include ingredients capable of providing various flavors or tastes to a user. Vitamin mixtures may be a mixture of at least one of vitamin A, vitamin B, vitamin C, and vitamin E, but are not limited thereto. Also, the liquid composition may include an aerosol forming substance, such as glycerin and propylene glycol.

The liquid delivery element may deliver the liquid composition of the liquid storage to the heating element. For example, the liquid delivery element may be a wick such as cotton fiber, ceramic fiber, glass fiber, or porous ceramic, but is not limited thereto.

The heating element is an element for heating the liquid composition delivered by the liquid delivery element. For example, the heating element may be a metal heating wire, a metal hot plate, a ceramic heater, or the like, but is not limited thereto. In addition, the heating element may include a conductive filament such as nichrome wire and may be wound around the liquid delivery element. The heating element may be heated by electrical current and may transfer heat to the liquid composition in contact with the heating element, thereby heating the liquid composition. As a result, aerosol may be generated.

For example, the vaporizer 14000 may be referred to as a cartomizer or an atomizer, but it is not limited thereto.

The aerosol generating device 10000 may further include general-purpose components in addition to the battery 11000, the controller 12000, and the heater 13000. For example, the aerosol generating device 10000 may include a display capable of outputting visual information and/or a motor for outputting haptic information. Also, the aerosol generating device 10000 may include at least one sensor (a puff detecting sensor, a temperature detecting sensor, a cigarette insertion detecting sensor, etc.). Also, the aerosol generating device 10000 may be formed as a structure where, even when the cigarette 20000 is inserted into the aerosol generating device 10000, external air may be introduced or internal air may be discharged.

Although not illustrated in FIGS. 1 and 2, a cradle may be used with the aerosol generating device 10000 and an additional cradle, forming a system. For example, the cradle may be used to charge the battery 11000 of the aerosol generating device 10000. Alternatively, the heater 13000 may be heated when the cradle and the aerosol generating device 10000 are coupled to each other.

The cigarette 20000 may be similar to a general combustive cigarette. For example, the cigarette 20000 may be divided into a first portion including an aerosol generating material and a second portion including a filter, etc. Alternatively, the second portion of the cigarette 20000 may also include an aerosol generating material. For example, an aerosol generating material made in the form of granules or capsules may be inserted into the second portion.

The entire first portion may be inserted into the aerosol generating device 10000, and the second portion may be exposed to the outside. Alternatively, only a portion of the first portion may be inserted into the aerosol generating device 10000. Otherwise, the entire first portion and a portion of the second portion may be inserted into the aerosol generating device 10000. The user may puff aerosol while holding the second portion by the mouth of the user. In this case, the aerosol is generated by the external air passing through the first portion, and the generated aerosol passes through the second portion and is delivered to the user's mouth.

For example, the external air may flow into at least one air passage formed in the aerosol generating device 10000. For example, opening and closing of the air passage and/or a size of the air passage may be adjusted by the user. Accordingly, the amount of smoke and smoking satisfaction may be adjusted by the user. As another example, the external air may flow into the cigarette 20000 through at least one hole formed in a surface of the cigarette 20000.

Hereinafter, an example of the cigarette 20000 will be described with reference to FIG. 3.

Figure 3:
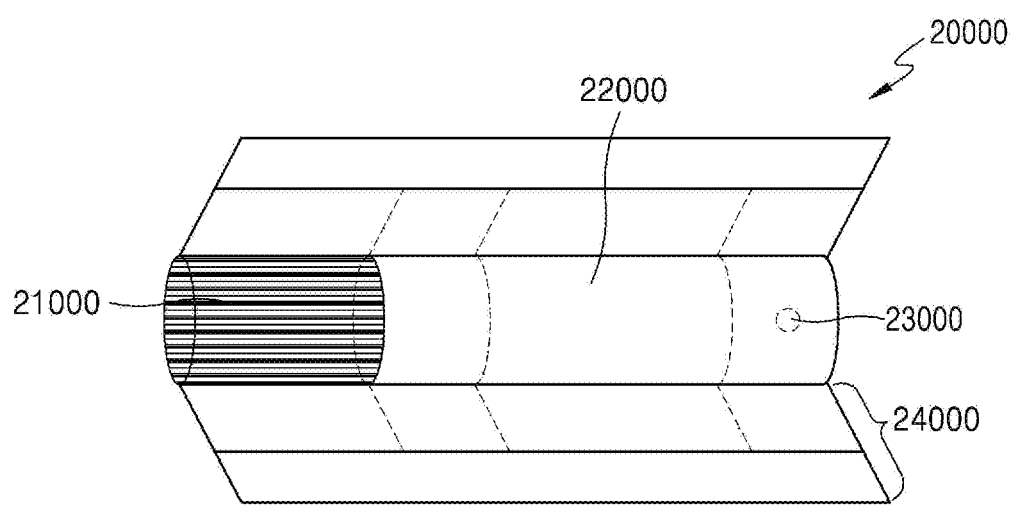
FIG. 3 is a drawing illustrating an example of a cigarette.

FIG. 3 is a drawing illustrating an example of a cigarette.

Referring to FIG. 3, the cigarette 20000 may include a tobacco rod 21000 and a filter rod 22000. The first portion described above with reference to FIGS. 1 and 2 may include the tobacco rod 21000, and the second portion may include the filter rod 22000.

FIG. 3 illustrates that the filter rod 22000 includes a single segment. However, the filter rod 22000 is not limited thereto. In other words, the filter rod 22000 may include a plurality of segments. For example, the filter rod 22000 may include a first segment configured to cool an aerosol and a second segment configured to filter a certain component included in the aerosol. Also, as necessary, the filter rod 22000 may further include at least one segment configured to perform other functions.

The cigarette 2000 may be packaged using at least one wrapper 24000. The wrapper 24000 may have at least one hole through which external air may be introduced or internal air may be discharged. For example, the cigarette 20000 may be packaged using one wrapper 24000. As another example, the cigarette 20000 may be doubly packaged using at least two wrappers 24000. For example, the tobacco rod 21000 may be packaged using a first wrapper, and the filter rod 22000 may be packaged using a second wrapper. Also, the tobacco rod 21000 and the filter rod 22000, which are respectively packaged using separate wrappers, may be combined and packaged together using a third wrapper. When each of the tobacco rod 21000 and the filter rod 22000 includes a plurality of segments, each segment may be packaged using a separate wrapper. Also, the entire cigarette 20000 including the plurality of segments, which are respectively packaged using the separate wrappers and which are coupled to each other, may be re-packaged using another wrapper.

The tobacco rod 21000 may include an aerosol generating material. For example, the aerosol generating material may include at least one of glycerin, propylene glycol, ethylene glycol, dipropylene glycol, diethylene glycol, triethylene glycol, tetraethylene glycol, and oleyl alcohol, but it is not limited thereto. Also, the tobacco rod 21000 may include other additives, such as flavors, a wetting agent, and/or organic acid. Also, the tobacco rod 21000 may include a flavored liquid, such as menthol or a moisturizer, which is injected to the tobacco rod 21000.

The tobacco rod 21000 may be manufactured in various forms. For example, the tobacco rod 21000 may be formed as a sheet or a strand. Also, the tobacco rod 21000 may be formed as a pipe tobacco, which is formed out of tiny bits cut from a tobacco sheet. Also, the tobacco rod 21000 may be surrounded by a heat conductive material. For example, the heat conductive material may be, but is not limited to, a metal foil such as aluminum foil. For example, the heat conductive material surrounding the tobacco rod 21000 may uniformly distribute heat transmitted to the tobacco rod 21000, and thus, the heat conductivity applied to the tobacco rod may be increased and taste of the tobacco may be improved. Also, the heat conductive material surrounding the tobacco rod 21000 may function as a susceptor heated by the induction heater. Here, although not illustrated in the drawings, the tobacco rod 21000 may further include an additional susceptor, in addition to the heat conductive material surrounding the tobacco rod 21000.

The filter rod 22000 may include a cellulose acetate filter. Shapes of the filter rod 22000 are not limited. For example, the filter rod 22000 may include a cylinder-type rod or a tube-type rod having a hollow inside. Also, the filter rod 22000 may include a recess-type rod. When the filter rod 22000 includes a plurality of segments, at least one of the plurality of segments may have a different shape.

The filter rod 22000 may be formed to generate flavors. For example, a flavoring liquid may be injected onto the filter rod 22000, or an additional fiber coated with a flavoring liquid may be inserted into the filter rod 22000.

Also, the filter rod 22000 may include at least one capsule 23000. Here, the capsule 23000 may generate a flavor or aerosol. For example, the capsule 23000 may have a configuration in which a liquid containing a flavoring material is wrapped with a film. For example, the capsule 23000 may have a spherical or cylindrical shape, but is not limited thereto.

When the filter rod 22000 includes a segment configured to cool the aerosol, the cooling segment may include a polymer material or a biodegradable polymer material. For example, the cooling segment may include pure polylactic acid alone, but the material for forming the cooling segment is not limited thereto. In some exemplary embodiments, the cooling segment may include a cellulose acetate filter having a plurality of holes. However, the cooling segment is not limited to the above-described example and is not limited as long as the cooling segment cools the aerosol.

Although not illustrated in FIG. 3, the cigarette 20000 according to an exemplary embodiment may further include a front-end filter. The front-end filter may be located on a side of the tobacco rod 21000, which is the side not facing the filter rod 22000. The front-end filter may prevent the tobacco rod 21000 from being detached outwards and prevent a liquefied aerosol from flowing into the aerosol generating device 10000 (FIGS. 1 and 2) from the tobacco rod 21000, during smoking.

Figure 4:
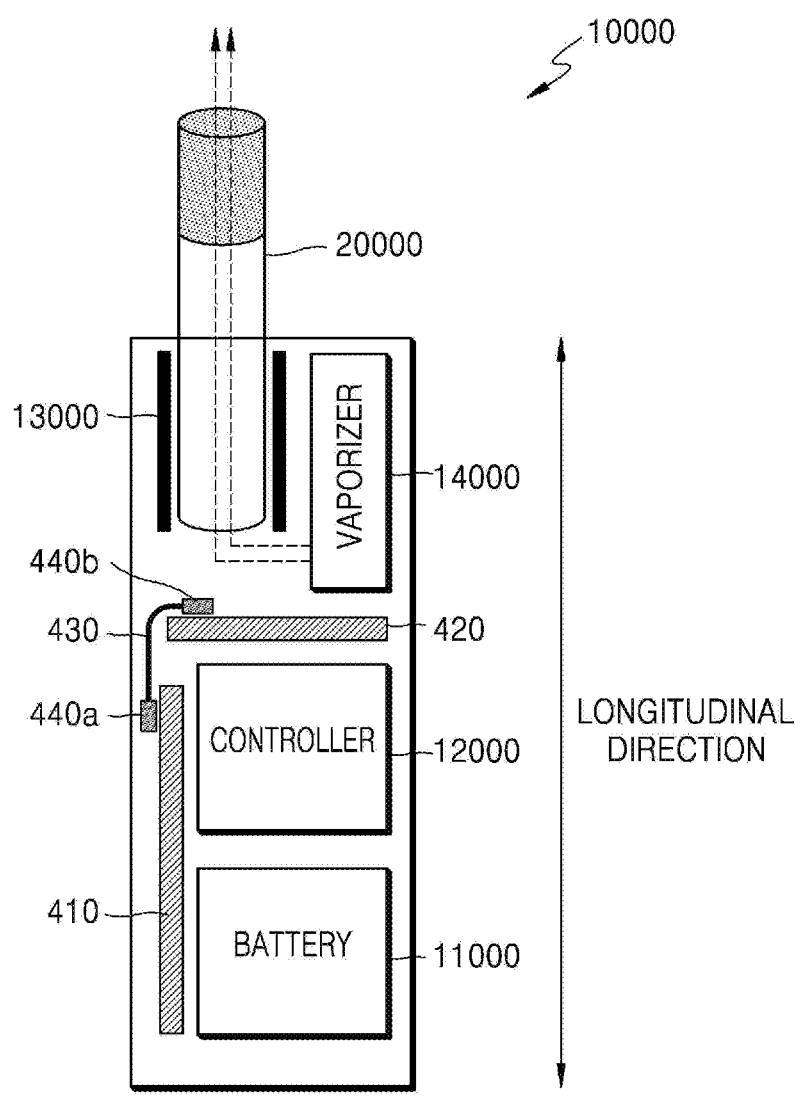
FIG. 4 is a view illustrating an aerosol generating device including a rigid printed circuit board (PCB) and a flexible PCB according to an exemplary embodiment.

FIG. 4 is a view illustrating an aerosol generating device including a rigid printed circuit board (PCB) and a flexible PCB according to an exemplary embodiment.

The same description provided above with reference to FIG. 3 will be omitted here for convenience of explanation.

The aerosol generating device 10000 may include a plurality of PCBs. In an exemplary embodiment, the aerosol generating device 10000 may include a main PCB 410, an auxiliary PCB 420, and a connecting PCB 430 that electrically connects the main PCB 410 to the auxiliary PCB 420.

Referring to FIG. 4, the main PCB 410 may be located parallel to a longitudinal direction of the aerosol generating device 10000, and the auxiliary PCB 420 may be located perpendicular to the longitudinal direction of the aerosol generating device 10000.

In an exemplary embodiment, the main PCB 410 may be located parallel to the longitudinal direction of the aerosol generating device 10000 at a side of the battery 11000, and the auxiliary PCB 420 may be located perpendicular to the longitudinal direction of the aerosol generating device 10000 between the heater 13000 (or the vaporizer 14000) and a battery 11000.

Also, the battery 11000 and the controller 12000 may be located in serial in the longitudinal direction of the aerosol generating device 10000, and the main PCB 410 may be located at a side of the battery 11000 and the controller 12000. In this case, the main PCB 410 may be located parallel to the longitudinal direction of the aerosol generating device 10000 over at least a part of the controller 12000 and the battery 11000. The heater 13000 and the vaporizer 14000 may be serially located in a direction perpendicular to the longitudinal direction of the aerosol generating device 10000. The auxiliary PCB 420 may be located facing at least one side of the heater 13000 and the vaporizer 14000. In this case, the auxiliary PCB 420 may be located perpendicular to the longitudinal direction of the aerosol generating device 10000 over at least a part of the vaporizer 14000 and the heater 13000. The auxiliary PCB 420 may be located between the controller 12000, and the heater 13000 and the vaporizer 14000.

The connecting PCB 430 may be curved and may contact a portion of the main PCB 410 and a portion of the auxiliary PCB 420 to electrically connect the main PCB 410 to the auxiliary PCB 420. The connecting PCB 430 may contact a portion of a top surface or a bottom surface of each of the main PCB 410 and the auxiliary PCB 420.

In an exemplary embodiment, when the main PCB 410 is located parallel to the longitudinal direction of the aerosol generating device 10000 at a side of the battery 11000 and the controller 12000, the connecting PCB 430 may contact an end portion of the main PCB 410 close to an insertion side and an end portion of the auxiliary PCB 420 adjacent to the end portion of the main PCB 410 close to the insertion side to electrically connect the main PCB 410 to the auxiliary PCB 420. The insertion side refers to a direction toward the portion of the aerosol generating device 10000 where the cigarette 2000 is inserted.

However, the arrangement of the main PCB 410, the auxiliary PCB 420, and the connecting PCB 430 inside the aerosol generating device 10000 is not limited thereto.

In an exemplary embodiment, the main PCB 410 and the auxiliary PCB 420 may be formed using a rigid material. For example, the rigid material of the main PCB 410 and the auxiliary PCB 420 may be one of Flame Retardant-1 (FR-1), Flame Retardant-2 (FR-2), Flame Retardant-3 (FR-3), Flame Retardant-4 (FR-4), Composite Epoxy Material-1 (CEM-1), and Composite Epoxy Material-3 (CEM-3). However, the present disclosure is not limited thereto.

Each of the main PCB 410 and the auxiliary PCB 420 may include an insulating layer and a conductive layer, and may be a build-up PCB in which the insulating layer and the conductive layer are alternately stacked. For example, each of the main PCB 410 and the auxiliary PCB 420 may be a 6-layer PCB.

In an exemplary embodiment, the connecting PCB 430 may be formed using a flexible material. For example, the flexible material of the connecting PCB 430 may be polyimide. Because the connecting PCB 430 is located adjacent to the heater 13000 and/or the vaporizer 14000, a temperature of the connecting PCB 430 may increase to a high temperature during an operation of the aerosol generating device 10000. Because polyimide may withstand up to 400° C., degradation of reliability may be prevented when the connecting PCB 430 is made using polyimide. Also, PCB manufacturing costs may be reduced and assembly performance may be improved.

The connecting PCB 430 may include a first insulating layer, a conductive layer formed on the first insulating layer, and a second insulating layer stacked on the conductive layer. In an exemplary embodiment, the conductive layer may include copper and the first and second insulating layers may include polyimide, but the present disclosure is not limited thereto.

The connecting PCB 430 includes a connecting area for connecting the main PCB 410 and the auxiliary PCB 420, and the connecting area may include a plating layer plated on the conductive layer exposed by peeling off the second insulating layer. For example, the conductive layer formed out of copper may be exposed by peeling a portion of the second insulating layer formed out of polyimide, and the connecting area of the connecting PCB 430 may be formed by plating the exposed conductive layer with gold.

The main PCB 410 and the auxiliary PCB 420 may be electrically connected to the connecting PCB 430 through the plating layer of the connecting area. In an exemplary embodiment, the connecting area (i.e., the plating layer) of the connecting PCB 430 may be located on both end portions of the connecting PCB 430. That is, the end portions of the connecting PCB 430 may respectively contact the main PCB 410 and the auxiliary PCB 420, thereby electrically connecting the main PCB 410 to the auxiliary PCB 420.

The heat capacity of the connecting PCB 430 may be increased by plating the copper layer exposed on both end portions of the connecting PCB 430 with gold, and thus, the connecting PCB 430 may be prevented from being overheated by the heater 13000 and/or the vaporizer 14000.

Because the auxiliary PCB 420 is located adjacent to the heater 13000 and/or the vaporizer 14000 in an exemplary embodiment, a temperature of the auxiliary PCB 420 may increase to a high temperature during an operation of the aerosol generating device 10000. In this case, the auxiliary PCB 420 may be prevented from being overheated by attaching a heat dissipating plate to the auxiliary PCB 420 or using the auxiliary PCB 420 having a heat dissipating function. Examples of a heat dissipating material may include silicon, rubber, and gel.

When a circuit of the aerosol generating device 10000 is configured by using only a single PCB, the single PCB may extend from one end to the other end in a longitudinal direction of the aerosol generating device 10000. Referring to FIG. 4, when a circuit of the aerosol generating device 10000 is configured by separating a PCB into the main PCB 410 and the auxiliary PCB 420, instead of configuring a circuit by using only a single PCB, an internal space of the aerosol generating device 10000 may be more efficiently used and thus a total size of the aerosol generating device 10000 may be reduced.

In another exemplary embodiment, the auxiliary PCB 420 may be a flexible PCB including a material such as polyimide. When the auxiliary PCB 420 and the main PCB 410 are manufactured by using different materials and are spaced apart from each other to be independent of each other, manufacturing costs may be reduced and assembly performance may be improved when compared with a case where one PCB is manufactured by using a rigid material.

Figure 5:
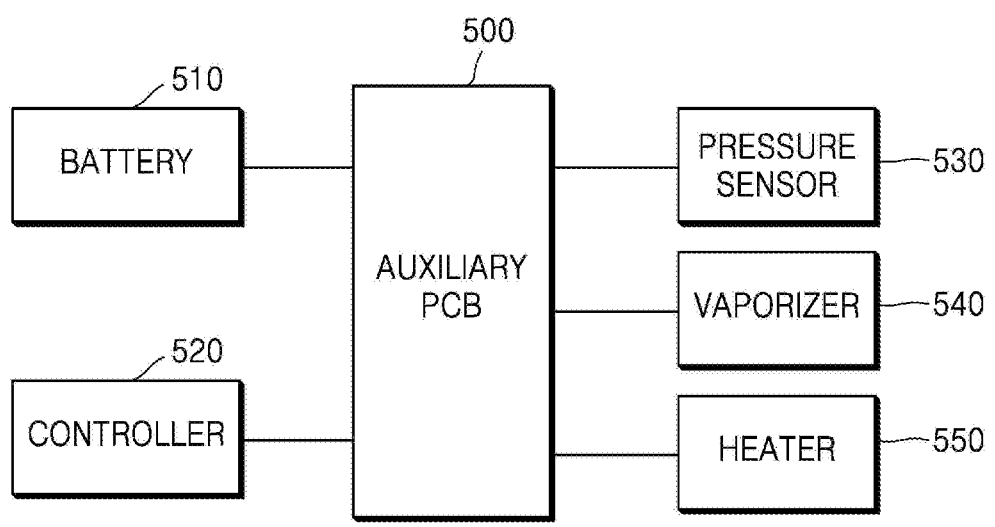
FIG. 5 is a block diagram illustrating components connected to an auxiliary PCB according to an exemplary embodiment.

FIG. 5 is a block diagram illustrating components connected to an auxiliary PCB according to an exemplary embodiment.

Referring to FIG. 5, an auxiliary PCB 500 may be electrically connected to a battery 510, a controller 520, a pressure sensor 530, a vaporizer 540, and a heater 550. However, this is merely an example, and the auxiliary PCB 500 may be electrically connected to other components in addition to the components (i.e., 510 through 550) of FIG. 5. Some of the components (i.e., 510 through 550) of FIG. 5 may be omitted.

The auxiliary PCB 500 may be electrically connected to the battery 510 and the controller 520. The controller 520 may be attached to, for example, the auxiliary PCB 500, and may be electrically connected to the auxiliary PCB 500. The battery 510 supplies power to operate components of an aerosol generating device, and the controller 520 is hardware for controlling an overall operation of the aerosol generating device.

The pressure sensor 530 detects an inhalation pressure when a cigarette inserted into the aerosol generating device is inhaled. The pressure sensor 530 generates a signal by detecting an inhalation pressure that is the pressure of the air introduced from the outside during a user's operation (puff operation) of inhaling a cigarette. In an exemplary embodiment, the pressure sensor 530 may be located in an airflow path in which the air introduced from the outside by the user's puff operation flows. The auxiliary PCB 500 may be electrically connected to the pressure sensor 530.

Components of the vaporizer 540 may include, but are not limited to, a liquid storage, a liquid transmitting device, and a heating element. A liquid composition stored in the liquid storage may be a liquid including a tobacco-containing material and/or a non-tobacco material. The liquid transmitting device may include wicks such as porous ceramics and may transmit the liquid composition in the liquid storage to the heating element. The heating element heats the liquid composition transmitted by the liquid transmitting device. The auxiliary PCB 500 may be electrically connected to the vaporizer 540.

The heater 550 may heat an aerosol generating material included in the cigarette. When the cigarette is inserted into the aerosol generating device, the heater 550 may be located outside or inside the cigarette. For example, the heater 550 may include a tube-type heating element, a plate-type heating element, a needle-type heating element, or a rod-type heating element, and may heat the inside or the outside of the cigarette according to a shape of the heating element. The auxiliary PCB 500 may be electrically connected to the heater 550.

Figure 6:
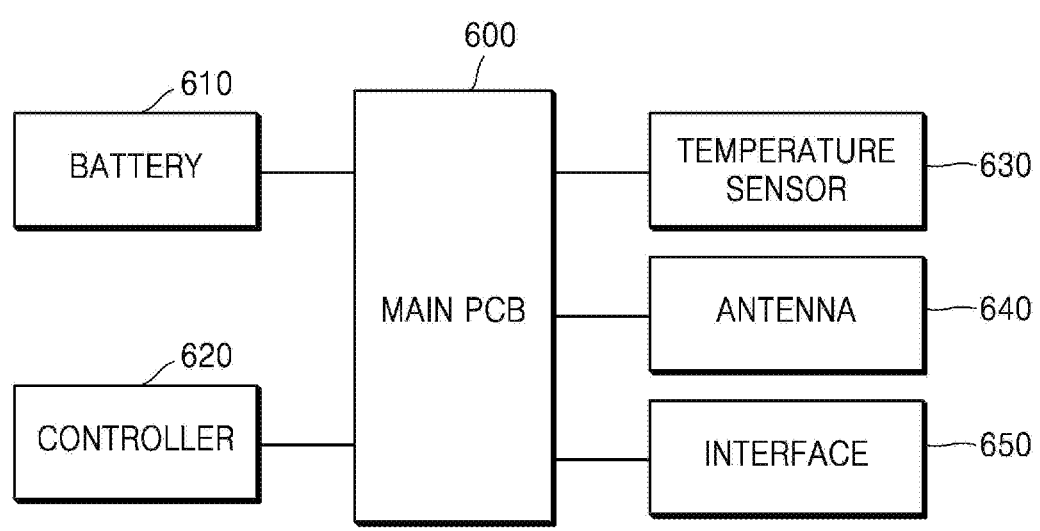
FIG. 6 is a block diagram illustrating components connected to a main PCB according to an exemplary embodiment.

FIG. 6 is a block diagram illustrating components connected to a main PCB according to an exemplary embodiment.

Referring to FIG. 6, a main PCB 600 may be electrically connected to a battery 610, a controller 620, a temperature sensor 630, an antenna 640, and an interface 650. The controller 620 may be attached to, for example, the main PCB 600 and may be electrically connected to the main PCB 600. However, this is merely an example, and the main PCB 600 may be electrically connected to other components in addition to the components (610 through 650) of FIG. 6. Some of the components (610 through 650) of FIG. 6 may be omitted.

The same description provided above with reference to FIG. 5 will not be repeated herein for convenience of explanation.

The temperature sensor 630 may detect a temperature of a heater that heats a cigarette. In an exemplary embodiment, a temperature of the heater may be detected by measuring a resistance value of the temperature sensor 630. The temperature sensor 630 may be located on a side wall or a bottom wall of an accommodation passage in which the cigarette is accommodated. However, a temperature sensing method and a position of the temperature sensor 630 are not limited thereto. The main PCB 600 may be electrically connected to the temperature sensor 630.

The antenna 640 may communicate with the outside. The antenna 640 may be a Bluetooth® antenna for wireless communication. The main PCB 600 may be electrically connected to the antenna 640.

The interface 650 may include a display or a lamp that outputs visual information, a motor that outputs tactile information, and a speaker that outputs sound information. The main PCB 600 may be electrically connected to the interface 650.

Figure 7:
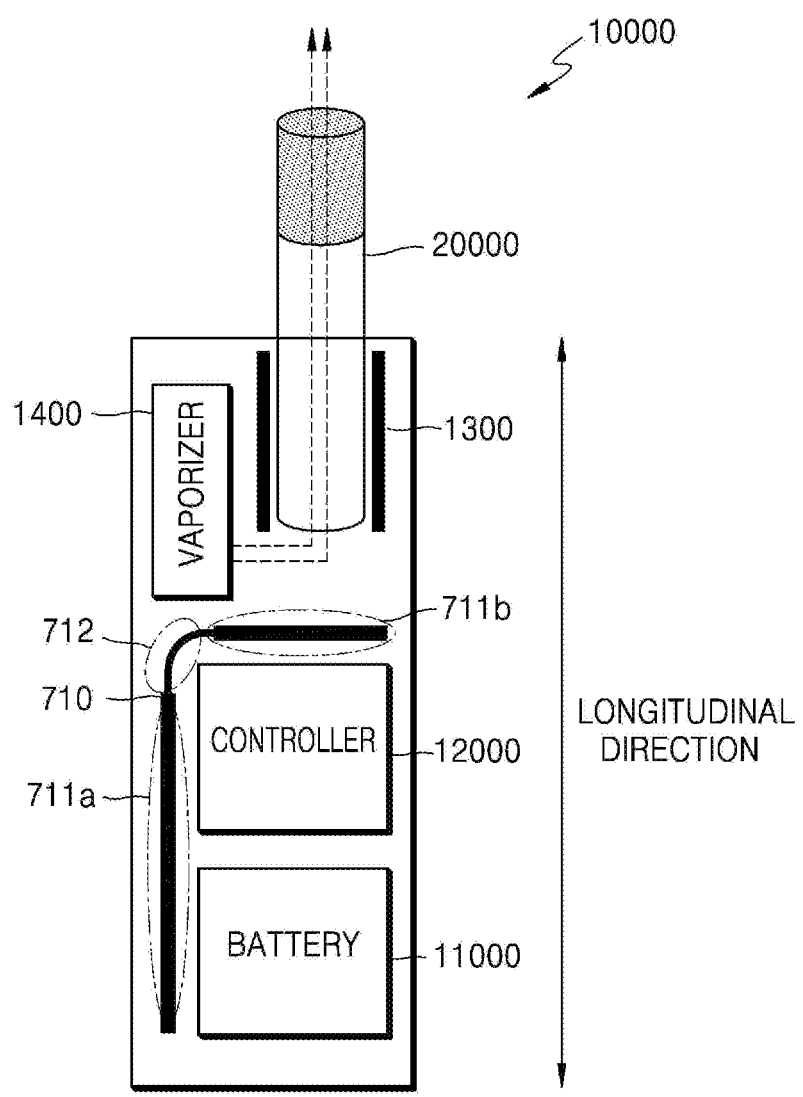
FIG. 7 is a view illustrating an aerosol generating device including a rigid-flexible PCB according to an exemplary embodiment.

FIG. 7 is a view illustrating an aerosol generating device including a rigid-flexible PCB according to an exemplary embodiment.

Referring to FIG. 7, the aerosol generating device 10000 may include a rigid-flexible PCB 720. The rigid-flexible PCB 720 may be a single PCB.

The rigid-flexible PCB 720 may include a first rigid portion 711*a*, a second rigid portion 711*b*, and a flexible portion 712. The first rigid portion 711*a* may be located parallel to a longitudinal direction of the aerosol generating device 10000, the second rigid portion 711*b* may be located perpendicular to the longitudinal direction of the aerosol generating device 10000. The flexible portion 712 may be curved and may connect the first rigid portion 711*a* to the second rigid portion 711*b*.

In an exemplary embodiment, the first rigid portion 711*a* may be located parallel to the longitudinal direction of the aerosol generating device 10000 at a side of the battery 11000, and the second rigid portion 711*b* may be located perpendicular to the longitudinal direction of the aerosol generating device 10000 between the heater 13000 (or the vaporizer 14000) and the battery 11000.

Also, the battery 11000 and the controller 12000 may be serially arranged in the longitudinal direction of the aerosol generating device 10000, and the first rigid portion 711*a* may be located at a side of the battery 11000 and the controller 12000. In this case, the first rigid portion 711*a* may be located parallel to the longitudinal direction of the aerosol generating device 10000 over at least a part of the battery 11000 and the controller 12000. The heater 13000 and the vaporizer 14000 may be located parallel to a direction perpendicular to the longitudinal direction of the aerosol generating device 10000, and the second rigid portion 711*b* may be located at at least one side of the heater 13000 and the vaporizer 14000. In this case, the second rigid portion 711*b* may be located parallel to the longitudinal direction of the aerosol generating device 10000 over at least a part of the heater 13000 and the vaporizer 14000, and the second rigid portion 711*b* may be located between the heater 13000 and the vaporizer 14000, and the controller 12000.

In an exemplary embodiment, a rigid material for making the first rigid portion 711*a* and the second rigid portion 711*b* may include one of Flame Retardant-1 (FR-1), Flame Retardant-2 (FR-2), Flame Retardant-3 (FR-3), Flame Retardant-4 (FR-4), Composite Epoxy Material-1 (CEM-1), and Composite Epoxy Material-3 (CEM-3). However, the present disclosure is not limited thereto.

Also, a flexible material of the flexible portion 712 may be polyimide. Because the flexible portion 712 is located adjacent to the heater 13000 and/or the vaporizer 14000, a temperature of the flexible portion 712 may increase to a high temperature during an operation of the aerosol generating device 10000. Because polyimide may withstand up to 400° C., reliability degradation may be prevented when the flexible portion 712 is made using polyimide. Also, PCB manufacturing costs may be reduced and assembly performance may be improved.

Also, because the second rigid portion 711*b* is located adjacent to the heater 13000 and/or the vaporizer 14000, a temperature of the second rigid portion 711*b* may increase to a high temperature during an operation of the aerosol generating device 10000. In this case, by attaching a heat dissipating plate to the second rigid portion 711*b*, the second rigid portion 711*b* may be prevented from being overheated. Examples of a heat dissipating material may include silicon, rubber, and gel.

The first rigid portion 711*a* may be electrically connected to the battery 11000, the controller 12000, a pressure sensor (not shown), the vaporizer 14000, and the heater 13000. The second rigid portion 711*b* may be electrically connected to the battery 11000, the controller 12000, a temperature sensor (not shown), an antenna (not shown), and an interface (not shown).

When a circuit of the aerosol generating device 10000 is configured by using the rigid-flexible PCB 720, an internal space of the aerosol generating device 10000 may be more efficiently used and thus a total size of the aerosol generating device 10000 may be reduced.

Figure 8:
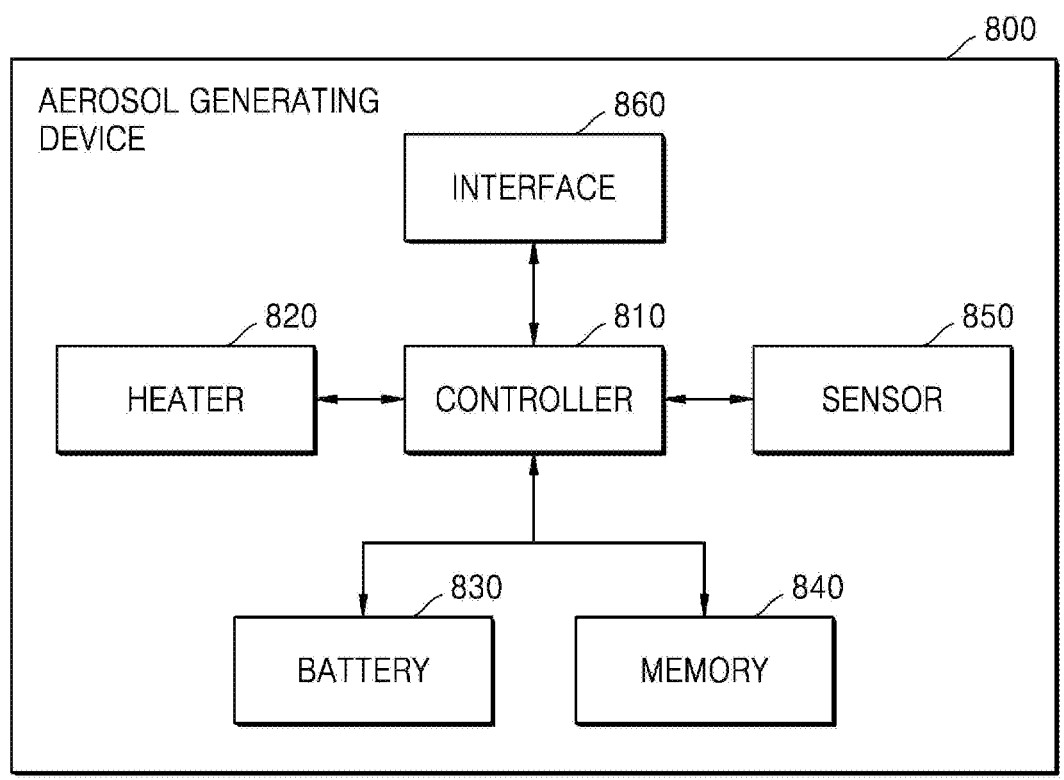
FIG. 8 is a block diagram illustrating a hardware configuration of an aerosol generating device.

FIG. 8 is a block diagram illustrating a hardware configuration of an aerosol generating device.

Referring to FIG. 8, an aerosol generating device 800 may include a controller 810, a heater 820, a battery 830, a memory 840, a sensor 850, and an interface 860.

The heater 820 may be electrically heated by power supplied from the battery 830 under the control of the controller 810. When a cigarette moves along an accommodation passage and an end portion of the cigarette reaches a bottom wall of an accommodator, the heater 820 may be located inside or outside the cigarette. Accordingly, the heater 820 that is heated may increase a temperature of an aerosol generating material in the cigarette. The heater 820 may be any heater as long as it may be inserted into the cigarette or may heat the outside of the cigarette. Also, the heater 820 may be heated partially.

The heater 820 may be an electro-resistive heater. For example, the heater 820 may include an electrically conductive track, and the heater 820 may be heated as current flows through the electrically conductive track.

For stable use, power according to the specifications of 3.2 V, 2.4 A, or 8 W may be supplied to the heater 820, but the present disclosure is not limited thereto. For example, when power is supplied to the heater 820, a surface temperature of the heater 820 may increase to 400° C. or more. The surface temperature of the heater 820 may increase to about 350° C. before 15 seconds after power supply to the heater 820 starts.

A separate temperature detecting sensor may be provided around the heater 820 of the aerosol generating device. Alternatively, a temperature detecting sensor may not be provided around the heater 820, and the heater 820 may function as a temperature detecting sensor. Otherwise, the heater 820 functions as a temperature detecting sensor, and a separate temperature detecting sensor may be further provided around the heater 820. In order for the heater 820 to function as a temperature detecting sensor, the heater 820 may include at least one electrically conductive track for emitting heat and detecting a temperature. Also, the heater 820 may include a first electrically conductive track for emitting heat and a second electrically conductive track for detecting a temperature.

For example, when a voltage applied to the second electrically conductive track and current flowing through the second electrically conductive track are measured, a resistance R may be determined. In this case, a temperature T of the second electrically conductive track may be determined by using Equation 1.

$$R = R_0\{1 + \alpha(T - T_0)\} \quad \text{[Equation 1]}$$

In Equation 1, R denotes a current resistance value of the second electrically conductive track, R0 denotes a resistance value at a temperature of T0 (e.g., 0° C.), and α denotes a resistance temperature coefficient of the second electrically conductive track. Because a conductive material (e.g., a metal) has a unique resistance temperature coefficient, α may be predetermined according to the conductive material included in the second electrically conductive track. Accordingly, when the resistance R of the second electrically conductive track is determined, the temperature T of the second electrically conductive track may be calculated by using Equation 1.

The heater 820 may include at least one electrically conductive track (e.g., the first electrically conductive track and the second electrically conductive track). For example, the heater 820 may include, but is not limited to, two first electrically conductive tracks and one or two second electrically conductive tracks.

The electrically conductive track includes an electro-resistive material. For example, the electrically conductive track may be formed out of a metal material. As another example, the electrically conductive track may be formed out of an electrically conductive ceramic material, carbon, a metal alloy, or a combination of a ceramic material and a metal.

Also, both the electrically conductive track and the temperature detecting sensor for functioning as a temperature detecting sensor may be provided around the heater 820.

The controller 810 is hardware that controls an overall operation of the aerosol generating device 800. The controller 810 is an integrated circuit including a processing unit such as a microprocessor or a microcontroller.

The controller 810 analyzes a result sensed by the sensor 850 and controls subsequent processes to be performed. The controller 810 may start or stop power supply from the battery 830 to the heater 820 according to the sensed result. Also, the controller 810 may control the amount of power supplied to the heater 820 and the time when power is supplied to the heater 820 so that the heater 820 is heated to a predetermined temperature or maintained at an appropriate temperature. Furthermore, the controller 810 may process various pieces of input information and output information of the interface 860.

The controller 810 may count the number of times a user smokes by using the aerosol generating device 800 and may control related functions of the aerosol generating device 800 to limit the user's smoking according to a counting result.

The memory 840 that is hardware for storing various pieces of data processed by the aerosol generating device 800 may store data processed and to be processed by the controller 810. The memory 840 may be any of various memories such as random-access memory (e.g., dynamic random-access memory (DRAM) or static random-access memory (SRAM)), read-only memory (ROM), or electrically erasable programmable read-only memory (EEPROM).

The memory 840 may store data about the user's smoking patterns such as a smoking time and the number of times the user smokes. Also, data related to a change in a reference temperature value when the cigarette is accommodated in an accommodation passage may be stored in the memory 840.

The battery 830 supplies power used for the aerosol generating device 800 to operate. That is, the battery 830 may supply power so that the heater 820 is heated. Also, the battery 830 may supply power required for operations of other hardware components provided in the aerosol generating device 800, such as the controller 810, the sensor 850, and the interface 860. The battery 830 may be a lithium iron phosphate (LiFePO4) battery, but the present disclosure is not limited thereto. The battery 830 may be a lithium cobalt oxide (LiCoO2) battery, or a lithium titanate battery. The battery 830 may be a rechargeable battery or a disposable battery.

The sensor 850 may include various types of sensors such as a puff detecting sensor (a temperature detecting sensor, a flow detecting sensor, a position detecting sensor, etc.), a cigarette insertion detecting sensor, and a temperature detecting sensor of the heater 820. A result sensed by the sensor 850 may be transmitted to the controller 810, and the controller 810 may control, according to the sensed result, the aerosol generating device 800 to perform various functions such as controlling a temperature of the heater 820, limiting smoking, determining whether the cigarette is inserted, and displaying an alarm.

The interface 860 may include various interfacing devices such as a display or a lamp for outputting visual information, a motor for outputting tactile information, a speaker for outputting sound information, terminals for receiving charging power or performing data communication with input/output (I/O) interfacing devices (e.g., buttons or a touchscreen) for receiving information input from the user or outputting information to the user, and a communication interfacing module for performing wireless communication (e.g., Wi-Fi, Wi-Fi Direct, Bluetooth, and Near-Field Communication (NFC)) with an external device. However, the aerosol generating device 800 may be implemented by selecting only some of the various interfacing devices.

While the disclosure has been particularly shown and described with reference to exemplary embodiments thereof, it will be understood by one of ordinary skill in the art that various changes in form and detail may be made therein without departing from the spirit and scope of the disclosure as defined by the following claims. Thus, the exemplary embodiments should be considered in a descriptive sense only and not for purposes of limitation. Therefore, the scope of the disclosure is defined not by the detailed description of the disclosure but by the appended claims, and all differences within the scope will be construed as being included in the disclosure.

What is claimed is:

1. An aerosol generating device comprising:
   at least one heater configured to generate aerosol by heating an aerosol generating material;
   a battery configured to supply power to heat the at least one heater;
   a controller; and
   a main printed circuit board (PCB) and an auxiliary PCB that are formed out of a rigid material,
   wherein the main PCB is located parallel to a longitudinal direction of the aerosol generating device, and the auxiliary PCB is located perpendicular to the longitudinal direction of the aerosol generating device, and
   wherein the main PCB and the auxiliary PCB are electrically connected to each other via a connecting PCB formed out of a flexible material.

2. The aerosol generating device of claim 1, wherein
   the main PCB is located parallel to the longitudinal direction of the aerosol generating device at a side of at least one of the battery and the controller, and
   the auxiliary PCB is located perpendicular to the longitudinal direction of the aerosol generating device between the at least one heater and the battery.

3. The aerosol generating device of claim 1, wherein the at least one heater comprises:
   a heater configured to heat the aerosol generating material included in a cigarette; and
   a vaporizer configured to generate aerosol by heating a liquid composition,
   wherein the auxiliary PCB is electrically connected to the heater and the vaporizer.

4. The aerosol generating device of claim 1, further comprising a pressure sensor configured to detect an inhalation pressure that is generated when a cigarette inserted into the aerosol generating device is inhaled,
   wherein the auxiliary PCB is electrically connected to the pressure sensor.

5. The aerosol generating device of claim 1, wherein the main PCB is electrically connected to at least one of a temperature sensor for detecting a temperature of the at least one heater, an antenna for wireless communication, and an interface for indicating an operation state of the aerosol generating device.

6. The aerosol generating device of claim 1, wherein
   the rigid material of the main PCB and the auxiliary PCB is Flame Retardant-4 (FR-4), and
   the flexible material of the connecting PCB is polyimide.

7. The aerosol generating device of claim 1, wherein a heat dissipating plate is attached to the auxiliary PCB to prevent the auxiliary PCB from being overheated by the at least one heater.

8. The aerosol generating device of claim 1, wherein
   the connecting PCB comprises a first insulating layer, a conductive layer formed on the first insulating layer, and a second insulating layer stacked on the conductive layer,
   the connecting PCB comprises a connecting area for connecting the main PCB to the auxiliary PCB, and the connecting area comprises a plating layer plated on the conductive layer exposed by peeling off the second insulating layer, and
   the main PCB and the auxiliary PCB are connected to the connecting PCB through the plating layer.

9. The aerosol generating device of claim 8, wherein
   each of the first insulating layer and the second insulating layer comprises polyimide,
   the conductive layer comprises copper, and
   the plating layer comprises gold.

10. An aerosol generating device comprising:
    at least one heater configured to generate aerosol by heating an aerosol generating material;
    a battery configured to supply power to heat the at least one heater;
    a controller; and
    a rigid-flexible printed circuit board (PCB),
    wherein a first rigid portion of the rigid-flexible PCB is located parallel to a longitudinal direction of the aerosol generating device, a second rigid portion is located perpendicular to the longitudinal direction of the aerosol generating device, and a flexible portion is curved and connects the first rigid portion to the second rigid portion.

11. The aerosol generating device of claim 10, wherein a material of the first rigid portion and the second rigid portion of the rigid-flexible PCB is Flame-Retardant 4 (FR-4), and a material of the flexible portion is polyimide.

12. The aerosol generating device of claim 10, wherein a heat dissipating plate is attached to the rigid-flexible PCB to prevent the rigid-flexible PCB from being overheated by the at least one heater.

\* \* \* \* \*